United States Patent [19]
Violette et al.

[11] Patent Number: 6,160,296
[45] Date of Patent: Dec. 12, 2000

[54] TITANIUM NITRIDE INTERCONNECTS

[75] Inventors: Michael P. Violette; Sanh Tang; Daniel M. Smith, all of Boise, Id.

[73] Assignee: Micron Technology, Inc., Boise, Id.

[21] Appl. No.: 09/338,211

[22] Filed: Jun. 22, 1999

Related U.S. Application Data

[62] Division of application No. 08/710,175, Sep. 13, 1996, Pat. No. 7,945,350.

[51] Int. Cl.⁷ .......................... H01L 29/76; H01L 29/94; H01L 23/48
[52] U.S. Cl. ...................... 257/377; 257/768; 257/770; 257/774; 257/763; 257/755
[58] Field of Search .................................. 257/377, 768, 257/770, 774, 763, 755

[56] References Cited

U.S. PATENT DOCUMENTS

| | | | |
|---|---|---|---|
| 5,122,225 | 6/1992 | Douglas | 438/642 |
| 5,146,309 | 9/1992 | Spinner et al. | 287/383 |
| 5,173,450 | 12/1992 | Wei | 438/620 |
| 5,208,170 | 5/1993 | Kobeda et al. | 438/625 |
| 5,268,590 | 12/1993 | Pfiester et al. | 257/764 |
| 5,302,539 | 4/1994 | Haken et al. | 257/228 |
| 5,332,913 | 7/1994 | Shappir | 257/305 |
| 5,360,996 | 11/1994 | Nulman et al. | 257/767 |
| 5,387,535 | 2/1995 | Wilmsmeyer | 438/621 |
| 5,394,358 | 2/1995 | Huang | 365/182 |
| 5,405,806 | 4/1995 | Pfiester et al. | 438/630 |
| 5,421,974 | 6/1995 | Witt | 438/565 |
| 5,434,044 | 7/1995 | Nulman et al. | 438/653 |
| 5,451,545 | 9/1995 | Ramaswami et al. | 438/649 |
| 5,654,570 | 8/1997 | Agnello | 257/338 |
| 5,700,737 | 12/1997 | Yu et al. | 438/636 |
| 5,741,741 | 4/1998 | Tseng | 438/637 |
| 5,981,328 | 11/1999 | Choi et al. | 438/238 |
| 6,075,266 | 11/1999 | Yoshitomi | 257/306 |

FOREIGN PATENT DOCUMENTS

| | | |
|---|---|---|
| 08321507 | 12/1996 | Japan . |
| 08330314 | 12/1996 | Japan . |

Primary Examiner—David Hardy
Assistant Examiner—Jhihan B Clark
Attorney, Agent, or Firm—Mueting, Raasch & Gebhardt, P.A.

[57] ABSTRACT

A method for use in the fabrication of semiconductor devices includes forming a titanium nitride film and depositing a silicon hard mask over the titanium nitride film. The silicon hard mask is used to pattern a titanium nitride interconnect from the titanium nitride film and the silicon hard mask is also used as a contact etch stop for forming a contact area. In forming the interconnect, the silicon hard mask is dry etched stopping selectively on and exposing portions of the titanium nitride film and the exposed portions of the titanium nitride film are etched resulting in the titanium nitride interconnect. In using the silicon hard mask as a contact etch stop, an insulating layer is deposited over the silicon hard mask and the insulating layer is etched using the silicon hard mask as an etch stop to form the contact area. The silicon hard mask is then converted to a metal silicide contact area. Interconnects formed using the method are also described.

3 Claims, 6 Drawing Sheets

TITANIUM NITRIDE INTERCONNECTS

This is a division of application Ser. No. 08/710,175, filed Sep. 13, 1996, U.S. Pat. No. 5,945,350 which is incorporated herein by reference.

FIELD OF THE INVENTION

The present invention relates to the fabrication of semiconductor devices. More particularly, the present invention relates to etching methods, methods of forming interconnects, and interconnects resulting from such methods.

BACKGROUND OF THE INVENTION

Various interconnects are formed in the fabrication of semiconductor devices. For example, in fabrication of static random access memories (SRAMs), local interconnects are used to increase packing density. Further, metal interconnects are utilized for other purposes, such as for providing bit line interconnection for such devices. The use of titanium nitride as part of an interconnect is beneficial as titanium nitride is a good diffusion barrier.

Various conventional processes are utilized for forming interconnects including titanium nitride films. For illustration, in one local interconnect process titanium is deposited after active areas, such as n-type and p-type doped active regions of a memory cell, are cleared for deposition. After the titanium is deposited, a rapid thermal anneal or other heat treatment is performed in a nitrogen atmosphere to form titanium nitride, such as in field oxide regions separating the active areas, and for forming titanium silicide in the active areas. The titanium thickness governs the resistivity of the local interconnect created, such as between the p-type and n-type active regions, and the thickness of titanium silicide to be formed in the active regions. The temperature of the heat treatment affects which phase of titanium silicide results from the heat treatment method and also affects the titanium silicide resistivity, as well. Further in this illustrative process, the titanium nitride formed is then patterned with conventional photolithography and the titanium nitride is wet etched, such as, for example, in an ammonium hydroxide/hydrogen peroxide aqueous solution.

However, such a local interconnect process couples the resistance of the interconnect to the thickness of the titanium deposited. As shallower junctions become utilized in, for example, memory device fabrication, the titanium thickness must also be reduced, which, in turn, undesirably increases the local interconnect resistance. Further, wet etching of the titanium nitride film is undesirable in that etching solutions, such as, for example, ammonium hydroxide/hydrogen peroxide aqueous solutions, also etch photoresist utilized for patterning the titanium nitride local interconnect.

In order to decouple the thickness of the titanium silicide in the active areas from the thickness of the local interconnect itself, another interconnect process has been utilized. This decoupled process separates the formation of the titanium silicide and the titanium nitride local interconnect film formation steps. Just as described in the previous local interconnect process, titanium is deposited after the active areas are cleared and a heat treatment is utilized to form titanium silicide in the active areas and also form titanium nitride in regions outside of the active areas. However, instead of patterning the titanium nitride formed during the heat treatment, the titanium nitride film formed during the heat treatment is removed using an etching solution, such as, for example, an ammonium hydroxide/hydrogen peroxide aqueous solution. The result is a salicided active area. Titanium nitride is then deposited, such as by sputtering, over the salicided active areas and the other structure thereabout. The separately deposited titanium nitride local interconnect film is then patterned with conventional photolithography and wet etched in an etching solution, such as the ammonium hydroxide/hydrogen peroxide aqueous solution.

As previously indicated, this process decouples the thickness of the titanium silicide in the active areas from the thickness of the titanium nitride interconnect. However, patterning the titanium nitride interconnect using conventional photolithography in which the photoresist etches undesirably as the titanium nitride interconnect film is etched still presents problems, such as severe undercut and poor patterning of narrow lines.

In order to alleviate the problem of etching the photoresist during the etching of the titanium nitride film, oxide hard masks have been utilized. For example, such a local interconnect process using an oxide hard mask is described with regard to the interconnection of p-type and n-type doped active regions (i.e., drain to drain in a SRAM device). Titanium is utilized to salicide the active regions, as previously described above. The n-type active area and p-type active area are isolated such as with a field oxide, but the spacing between the two active areas is small, such as, for example, less than 3 microns. A titanium nitride interconnect film connecting the two active areas is a desirable film to utilize because it does not allow cross-diffusion of the n- and p-type dopants therethrough. Therefore, the titanium nitride film is deposited upon the salicided active areas and the device structure thereabout, i.e. field oxide. An oxide hard mask is then deposited over the titanium nitride interconnect film for patterning purposes. The oxide hard mask is then patterned with photoresist and etched leaving portions of the titanium nitride film exposed. The photoresist remaining after the oxide is patterned and etched can then be removed with the exposed titanium nitride, such as with a piranha clean (i.e., sulfuric acid/hydrogen peroxide aqueous solution).

However, use of an oxide hard mask is undesirable for several reasons. First, the oxide hard mask etch after patterning with photoresist requires extensive overetch in order to remove stringers that are left behind during, for example, an anisotropic etch of the oxide hard mask patterned with use of the photoresist. Extending the overetch too far causes the etching of the underlying titanium nitride interconnect film more than is desirable. Further, if the titanium nitride interconnect film is to be utilized as a landing pad, such as for bit line contacts of memory cell devices, the titanium nitride film is too thin to be an effective contact etch stop or pad for the contact.

For the above reasons, there is a need in the art for etching methods and interconnection formation methods in conjunction with titanium nitride films. The present invention, as described further below, provides methods for overcoming the problems described above and other problems which will become apparent to one skilled in the art from the description below. Further, interconnects formed with such methods are also provided.

SUMMARY OF THE INVENTION

A method for use in the fabrication of semiconductor devices in accordance with the present invention includes forming a titanium nitride film and depositing a silicon hard mask over the titanium nitride film. The silicon hard mask is used to pattern a titanium nitride interconnect from the titanium nitride film. In addition, the silicon hard mask is used as a contact etch stop for forming a contact area.

Another method in accordance with the present invention for use in semiconductor device fabrication includes forming a titanium nitride film and depositing a silicon hard mask over the titanium nitride film. Portions of the silicon hard mask are dry etched, selectively stopping on the titanium nitride film.

In various embodiments of the method, the silicon hard mask includes an amorphous silicon hard mask or a polysilicon hard mask and the dry etching of the silicon hard mask uses a plasma including a fluorine containing gas. Further, the plasma may include at least one of helium and oxygen.

A method of forming an interconnect in accordance with the present invention is also described. The method includes converting at least one region of silicon substrate to a metal silicide. A titanium nitride film is formed on the metal silicide. A silicon hard mask is deposited over the titanium nitride film and the silicon hard mask is utilized to form a titanium nitride interconnect from the titanium nitride film.

In one embodiment of the method, the step of using the silicon hard mask to form the titanium nitride interconnect includes patterning the silicon hard mask using a photoresist. The patterning step includes dry etching portions of the silicon hard mask selectively stopping on and exposing portions of the titanium nitride film. The photoresist is then stripped after the silicon hard mask is dry etched and the exposed portions of the titanium nitride film are etched resulting in the titanium nitride interconnect.

Another method of forming an interconnect in accordance with the present invention is described. The method includes converting at least a region of silicon substrate to metal silicide and depositing a titanium nitride film on at least the metal silicide. A silicon hard mask is deposited over the titanium nitride film. Portions of the silicon hard mask are dry etched selectively stopping on and exposing portions of the titanium nitride film. The exposed portions of the titanium nitride film are etched resulting in a patterned titanium nitride and silicon hard mask interconnect sandwich. An insulating layer is deposited over at least the patterned interconnect sandwich and the insulating layer is etched using the silicon hard mask as an etch stop to form a silicon contact area. The silicon contact area is then salicided.

A method of forming an interconnect for a memory device having at least two active areas connected by the interconnect is also described. The at least two active areas of a silicon substrate are salicided forming metal silicide. A titanium nitride film is formed over at least the metal silicide of each of the at least two active areas and additional material therebetween. A silicon hard mask is deposited over the titanium nitride film. Portions of the silicon hard mask are dry etched stopping selectively on and resulting in exposed portions of the titanium nitride film. The exposed portions of the titanium nitride film are etched to form a titanium nitride interconnect between the at least two active regions.

The interconnect, in accordance with the present invention, includes a salicided active area and a patterned titanium nitride film formed on at least the salicided active area using a silicon hard mask. A titanium silicide contact area is formed upon reacting the silicon hard mask with a deposited titanium film.

Another interconnect for providing connection between at least two active areas of a memory cell separated by additional material is also described. The interconnect includes a first salicided active area and a second salicided active area. The first salicided active area and the second salicided active area are separated by the additional material. A titanium nitride interconnect film is formed to connect the first and second salicided active areas using a silicon hard mask.

DETAILED DESCRIPTION OF THE EMBODIMENTS

Figure 1:
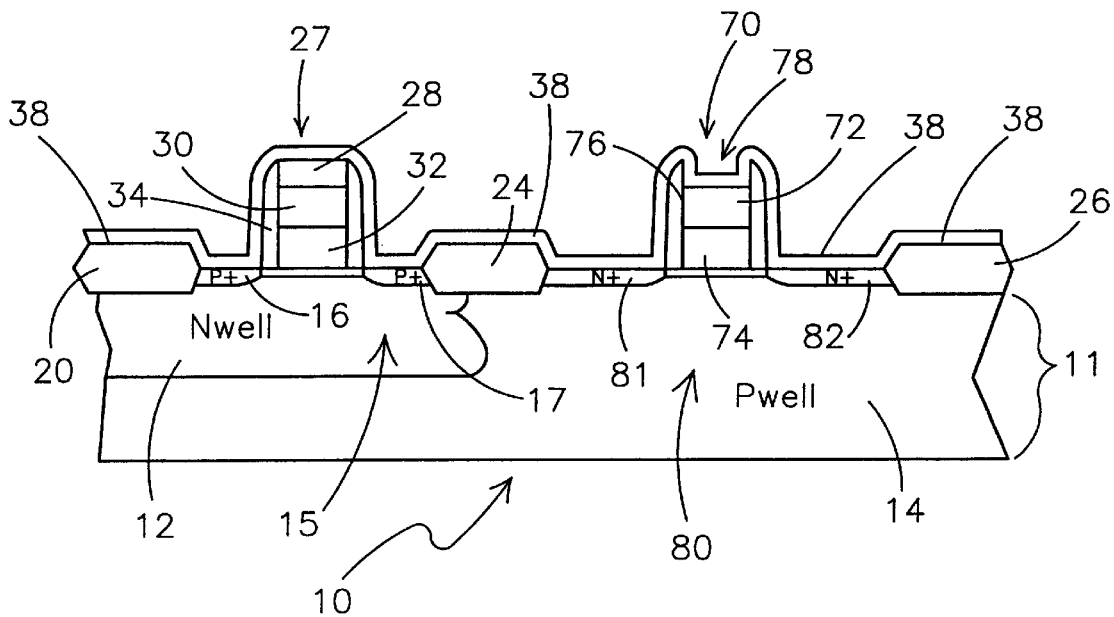
FIGS. 1–6 are illustrations showing the steps of forming a titanium nitride interconnect using a silicon hard mask in accordance with present invention.

The present invention shall be described with reference to FIGS. 1–11. Conventional semiconductor fabrication processing is carried out to form the integrated circuit structure 10 as shown in FIG. 1. The integrated circuit structure 10 is illustrative of a portion of a six transistor static random access memory (SRAM) cell. The circuit structure 10 includes a substrate 11 including a p-well 14 and an n-well 12. Field oxide regions 20, 24, and 26 are formed on the substrate 11 in accordance with conventional oxide deposition techniques. Gate oxides 22 and 23 are also formed by conventional techniques. Further, conventional photolithography is utilized to form p-type regions 16 and 17 in n-well 12, such regions representative of the source 16 and drain 17 of a first transistor 15. Gate 27 of the transistor 15 includes polysilicon region 32, a metal silicide region 30 (e.g., tungsten silicide), and an oxide region 28. Spacers 34 are also provided for the gate 27. The p-type active regions 16, 17 may be created by the implantation of boron utilizing $BF_2$ ion implantation or any other p-type dopant.

Likewise, a second transistor 80 is formed in p-well 14 utilizing conventional fabrication techniques. The transistor structure 80 includes n-type active regions 81 and 82 (i.e., source 82 and drain 81) and gate 70. Gate 70 includes a polysilicon region 74 and a metal silicide region 72. A contact region 78 is formed at the upper portion of gate 70 and spacers 76 are also provided for gate 70. The n-type active regions 81, 82 are formed by conventional photolithography techniques utilizing ion implantation of, for example, arsenic.

Figure 6:
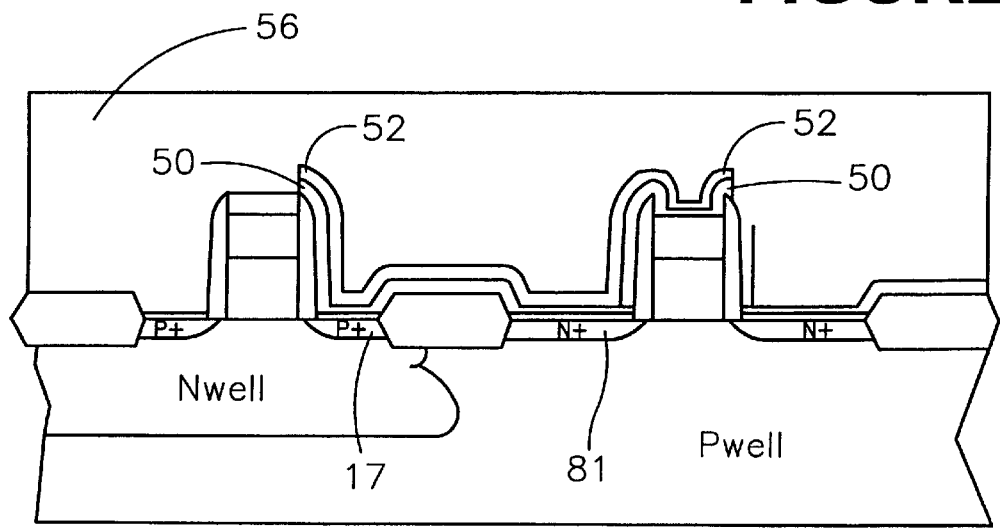
Figure 7:
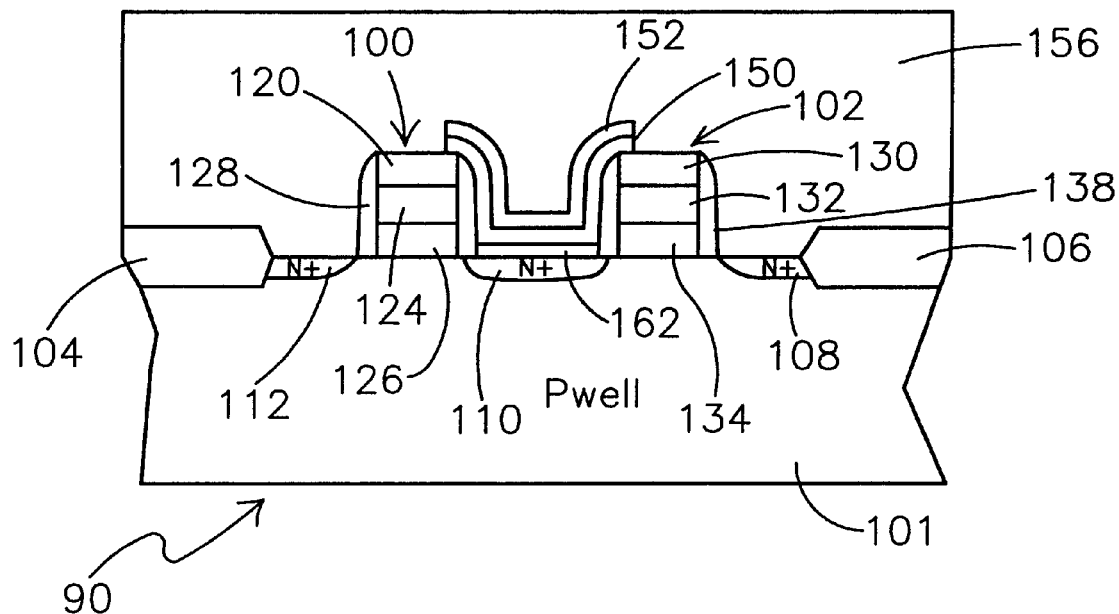
FIGS. 7–11 are illustrations showing the formation of a metal interconnect to a titanium nitride landing pad formed using the silicon hard mask in accordance with the present invention.
Figure 8:
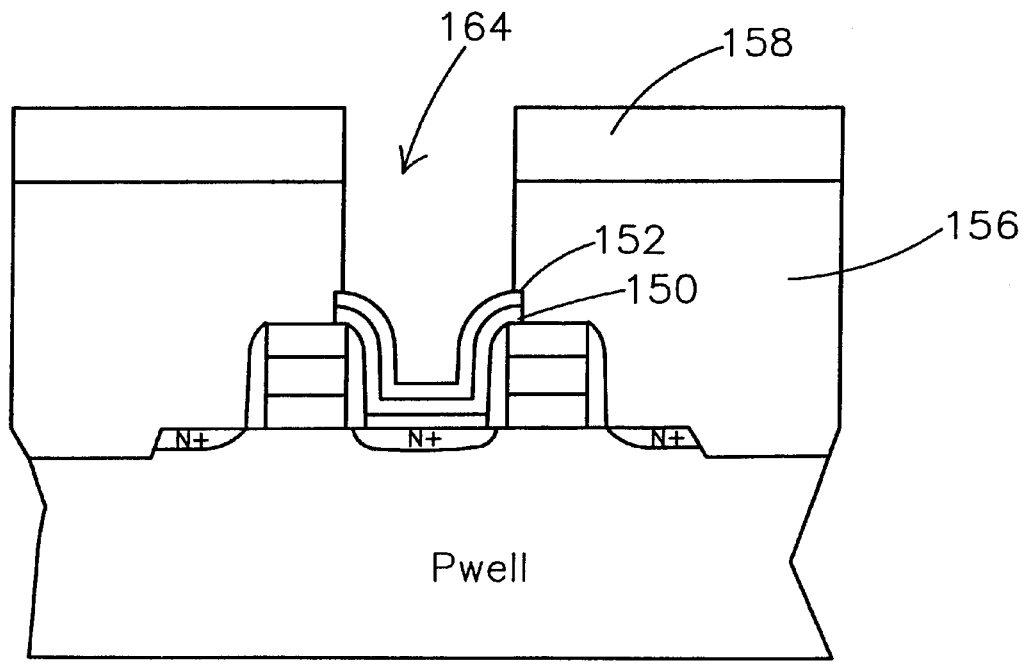
Figure 9:
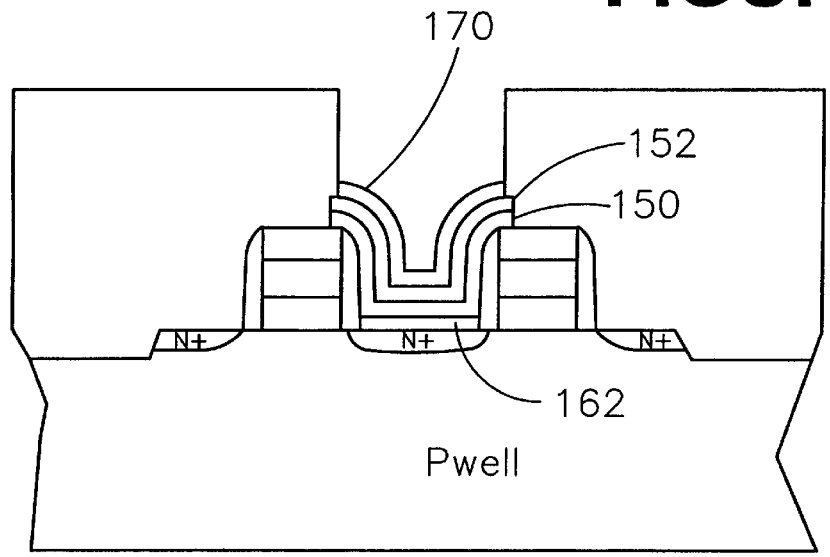

Field oxide 24 is utilized to isolate the drains 17 and 81 of the respective transistor devices 15 and 80. The two drains are closely spaced, for example, the distance between the p-type active region 17 and n-type active region 81 is about 3 microns or less and most likely less than 1 micron. In order to prevent diffusion of dopant ions between the p-type and n-type regions, a titanium nitride interconnect is utilized to locally interconnect the p-type drain 17 with the n-type drain 81. The titanium nitride local interconnect 50 connecting the drains is shown after formation in FIG. 6. As shown in FIG. 6, the titanium nitride local interconnect 50 also interconnects the gate 70 to the p-type drain 17 and n-type drain 81. It should be readily apparent to one skilled in the art that the uses of the formed titanium nitride interconnects described herein are for illustration only. There are various elements requiring interconnection in the fabrication of semiconductor devices which can benefit from the methods and interconnects described herein and the present invention is not limited to only the illustrative circuit configurations described herein.

The process steps for forming the titanium nitride interconnect 50 as shown in FIG. 6 shall be described with reference to FIGS. 1–6. A conventional salicide process utilizing titanium is performed to result in titanium silicide regions 44, 46 over the p-type drain and source regions 17, 16, respectively, and titanium silicide regions 42 and 48 over the n-type drain and source regions 81, 82, respectively. Although the present invention is described utilizing titanium in the salicide processes, one skilled in the art will recognize that in many circumstances other refractory or near noble metals will provide adequate characteristics when reacted with silicon, such as, for example, cobalt, tungsten, platinum, molybdenum, palladium, and tantalum.

The salicide process includes depositing a titanium film 38 over the circuit structure 10 as shown in FIG. 1. Such deposition of the titanium film may be deposited by any conventional method, such as, for example, evaporation, or chemical vapor deposition (CVD). By annealing the circuit structure 10 with the titanium film 38 deposited thereon, at, for example, a temperature in the range of about 600° C. to 800° C. in a nitrogen atmosphere, titanium silicide is formed in those active areas where the titanium rests directly on and reacts with the silicon, such as the p-type and n-type active regions 16, 17, 81, and 82. With the annealing process performed in a nitrogen atmosphere, titanium nitride regions 40 are formed over those areas where titanium silicide has not been created by the reaction of the titanium with the silicon. The annealing process may be a conventional furnace heat treatment or may be performed by rapid thermal anneal (RTA). Further, the anneal process may be performed with any number of temperature steps and/or multiple annealing periods.

Figure 2:
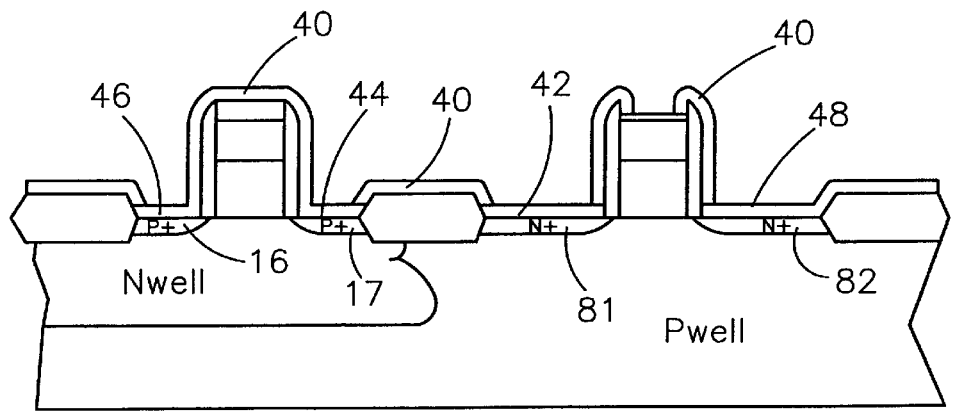

A wet etchant, such as, for example, an ammonia hydroxide/hydrogen peroxide aqueous solution or sulfuric acid/hydrogen peroxide aqueous solution, is then utilized to remove the titanium nitride regions 40, shown in FIG. 2. Any etchant, wet or dry, that etches titanium nitride but which is selective to titanium silicide may be used. The resulting structure (FIG. 3) from the salicide process includes titanium silicide region 46 over p-type region 16, titanium silicide region 44 over p-type region 17, titanium silicide region 42 over n-type region 81, and titanium silicide region 48 over n-type region 82.

Figure 3:
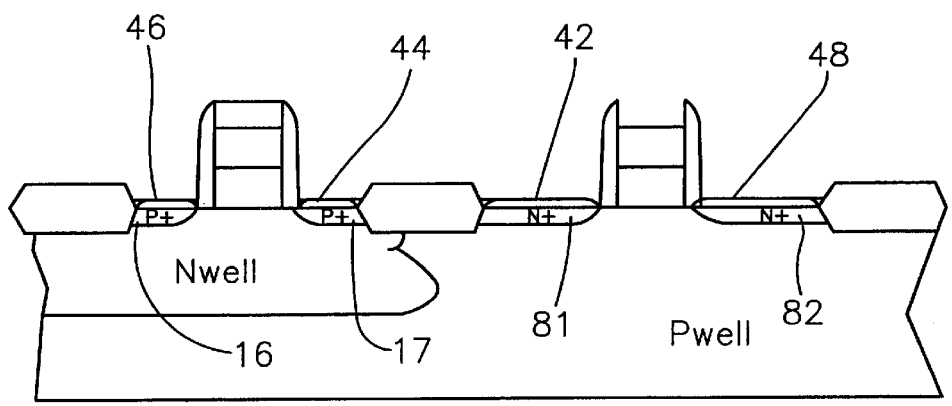
Figure 4:
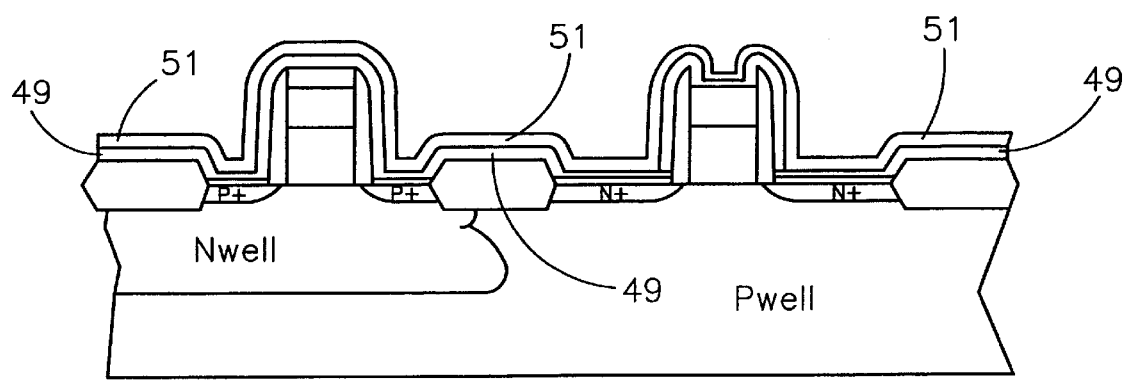

After the salicide process is completed, a titanium nitride layer 49 and silicon hard mask 51 are then deposited over the structure shown in FIG. 3. Each of these layers may be, for example, of a thickness in the range of about 100 Å to about 3000 Å.

The titanium nitride layer 49 can be deposited in various manners. For example, the titanium nitride film 49 can be formed by evaporating the titanium in a nitrogen ambient atmosphere, by reactively sputtering titanium in an argon arid nitrogen atmosphere, by sputtering from a titanium nitride target in an inert ambient atmosphere, by sputter depositing titanium in an argon ambient and converting it to titanium nitride in a separate plasma nitridation step, or by chemical vapor deposition. Preferably, the titanium nitride film 49 is deposited by sputtering titanium nitride in argon ambient atmosphere over the device structure shown in FIG. 3. A predeposition step to such sputtering is performed to remove $TiSi_xO_y$ formed over the active areas. Depending upon the process used for forming the titanium nitride film 49, an annealing step may be performed. An anneal step is not required if the titanium nitride film is sputtered from a titanium nitride target in argon ambient atmosphere.

The silicon hard mask 51 is then deposited over the titanium nitride film 49. The silicon hard mask 51 may be a deposited layer of amorphous silicon or polysilicon. The silicon hard mask 51 may be deposited using silicon hydrides or silanes such as dichlorosilane (DCS, $SiH_2Cl_2$), silane ($SiH_4$), disilane ($H_3SiSiH_3$), trichlorosilane (TCS, $SiHCl_3$), or any other silicon precursor known to one skilled in the art. For example, the silicon hard mask 51 may be deposited using silane at a temperature in the range of about 300° C. to about 600° C. and at a pressure in the range of about 5 mtorr to about 1000 mtorr. When deposition of the silicon hard mask is performed below about 575° C. and at a lower pressure in the above range, the hard mask is amorphous. Higher deposition temperatures or later performed heat treatment are used to produce polysilicon masks. However, any method of depositing a polysilicon layer or an amorphous silicon layer may be utilized in accordance with the present invention as would be known to one skilled in the art. Preferably, the silicon hard mask is a polysilicon hard mask deposited by silane decomposition at about 500° C.

Figure 5:
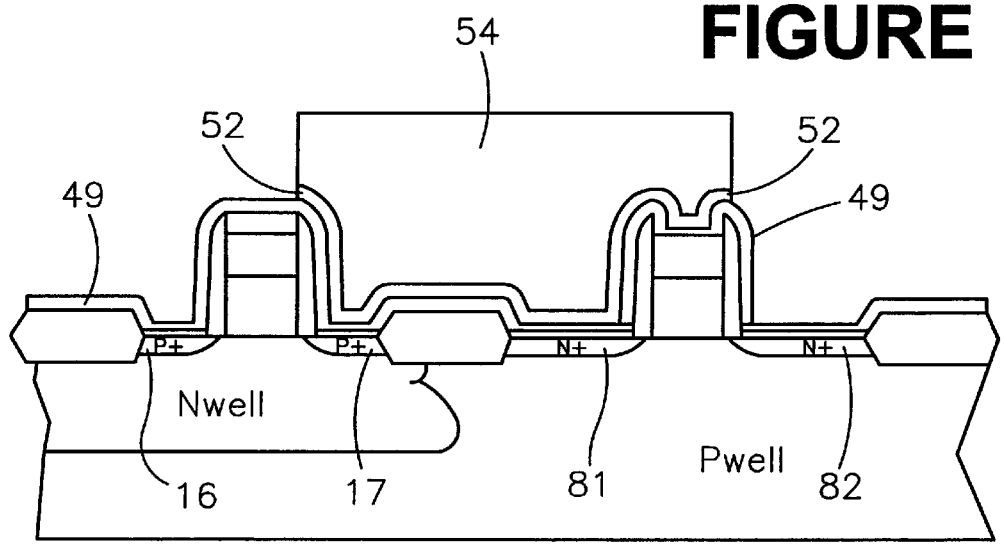

With the titanium nitride film 49 and silicon hard mask 51 deposited, photolithography is utilized to pattern the silicon hard mask 51. The photolithography process results in photoresist 54, as shown in FIG. 5, formed above the desired titanium nitride interconnect to be utilized for connecting the drains regions 17 and 81 of the respective transistor devices 15, 80 of FIG. 1. With the photoresist 54 in place, exposed portions of silicon hard mask 51 are dry etched.

The dry etch of the silicon hard mask 51 is performed using a plasma including a fluorine containing gas. Further, the plasma includes at least one of helium and oxygen. Preferably, the plasma includes the fluorine containing gas $NF_3$, helium, and oxygen. Although this plasma is preferable, any fluorine containing plasma having a high selectivity to the underlying titanium nitride film 49 may be utilized. Utilization of the silicon hard mask, in addition to the high selectivity of the dry etch gives ample etch latitude to produce a stringer-free interconnect as opposed to utilization of an oxide hard mask, which as described in the Background of the Invention section has conventionally been etched with a piranha clean, i.e. sulfuric acid/hydrogen peroxide aqueous solution.

More particularly, the dry etch process is performed in a plasma etching chamber, such as an etcher available from Applied Materials, Inc., Santa Clara, Calif., using a plasma having a gas flow rate of $NF_3$ in the range of about 10 sccm to about 50 sccm and a helium and oxygen gas mixture (70% He and 30% $O_2$) at a flow rate of about 5 sccm to about 30 sccm. Further, the excitation frequency is at a typical frequency for etchers of about 400 kHz or about 13.56 MHz and the power density is in the range of about 7 w/sq in to about 25 w/sq in. Further, the dry etch is preferably performed at a pressure in the range of about 20 mtorr to about 200 mtorr. The amount of isotropic or lateral etching is easily controlled by varying the pressure within this range. Further, the etch, depending upon the thickness of the silicon hard mask, may be in the range of about 20 seconds to about 60 seconds. Further, the dry etch is performed at in the range of about 20 Gauss to about 120 Gauss. One skilled in the art will recognize that various values for these parameters may be adequate to achieve the desired function and that the present invention is not limited to those given above or elsewhere herein. Rather, the present invention is limited only in accordance with the accompanying claims.

It should also be readily apparent to one skilled in the art that the fluorine containing gas may be any fluorine containing gas known to those skilled in the art for etching silicon, such as $SF_6$, $CF_4$ or any other etching gas suitable for etching silicon. The addition of oxygen to the plasma increases the etch rate and the addition of helium improves uniformity.

By using the selective dry etch as described above, the silicon hard mask may be etched while selectively stopping on the titanium nitride film 49. The dry etch exposes portions of the titanium nitride film 49 which are not to be part of the titanium nitride interconnect 50 (FIG. 6).

Following the dry etch of the silicon hard mask 51, the photoresist 54 is stripped utilizing a dry etch (i.e., an oxygen plasma). However, the photoresist strip could also be performed utilizing an organic stripper (i.e., phenol-based strippers).

After the photoresist 54 is stripped, the exposed portions of the titanium nitride film 49 are etched utilizing a wet etching solution, such as an ammonium hydroxide/hydrogen peroxide aqueous solution or sulfuric acid/hydrogen peroxide aqueous solution (i.e. piranha clean).

The local interconnect 50, as formed and shown in FIG. 6, connects the drain region 17 to the drain region 81 and the gate 70. The titanium interconnect 50 is sandwiched with the remaining silicon hard mask portions 52. Because the interconnect 50 is a titanium nitride interconnect (i.e. a diffusion barrier), diffusion of arsenic into the p-type drain region 17 or boron into the n-type drain region 81 is reduced. Further, because of the high selectivity of the dry etch performed, stringers are substantially prevented at structures of the device, such as, for example, the steps or edges of the oxide spacers, while the titanium nitride layer is not overetched. After the titanium nitride interconnect 50 is formed with the silicon hard mask 52 thereover, an insulating layer, such as a conventional oxide deposition and/or a conventional deposition of borophosphosilicate glass (BPSG), is performed resulting in the insulating layer 56.

Further, in accordance with the present invention, formation of a contact shall be described with reference to FIGS. 7–11. The illustrative contact described is a bit line contact for a memory cell. However, the description of the bit line contact is for illustration only as other contacts may be formed in like manners using the silicon hard mask as a contact etch stop as further described below.

As described above with regard to circuit structure 10, circuit structure 90 is also fabricated in accordance with conventional processing techniques through the doping of n-type active areas 108, 110, and 112, prior to forming titanium silicide region 162, titanium nitride interconnect 150 and silicon hard mask 152. As such, prior to forming the bit line contact utilizing the titanium nitride interconnect 150 and silicon hard mask 152, the circuit structure 90 includes p-well 101 having field oxide regions 104 and 106 deposited thereon in accordance with conventional techniques. Further, stacks 100 and 102, i.e., wordlines, are also formed followed by ion implantation for doping of n-type doped active regions 112, 110, and 108. The stack 110 may include, for example, a polysilicon region 126, a metal silicide region 128 (such as, for example, tungsten silicide), and an oxide region 120 (such as TEOS). Likewise, stack 102 includes polysilicon region 134, a metal silicide region 132, and an oxide region 130. Further, the stacks 100 and 102 include spacers 128 and spacers 138, respectively, at the side walls thereof.

As previously described with reference to FIGS. 1–6, at least n-type active region 110 is salicided using titanium forming a titanium silicide region 162. Thereafter, also as previously described with reference to the structure shown in FIGS. 4–6, titanium nitride interconnect 150 with silicon hard mask 152 thereon is formed. Thereafter, with the insulating layer 156 deposited thereon (i.e., such as by a conventional BPSG deposition), the insulating layer may be reflowed and/or planarized. A contact etch in accordance with the present invention to form a bit line contact hole 164 is then performed. It should be readily apparent that the formation of the sandwich of the titanium nitride interconnect 150 and silicon hard mask portion 152 can be performed in the same process used to form interconnect 50 and hard mask portions 52. However, formation of a contact as described herein maybe also performed in a completely separate process for different or like devices.

The contact etch utilizes photolithography to define the contact hole 164 with photoresist 158. The silicon hard mask 152 is utilized as the contact etch stop when etching the insulating layer 156. The etch performed may include the use of any plasma including a fluorine containing gas, such as, for example, $CF_4$, $CHF_3$, and $SF_6$. Any suitable etch may be performed which etches the insulating layer 156 but which is selective to the silicon hard mask. Because of the selectivity to the silicon hard mask, the silicon hard mask 152 provides a suitable etch stop, such that the titanium nitride interconnect 150 is not etched and remains of sufficient thickness for providing a landing pad for the bit line contact.

After the resist 158 is stripped utilizing either a dry etch or an organic wet etch method, a process for saliciding the silicon hard mask 152 is performed. For example, a titanium film 170 is sputtered for contact with the silicon hard mask 152. The circuit structure with the titanium film 170 deposited thereon is then annealed in a nitrogen atmosphere such that the titanium reacts with the silicon hard mask 152 for conversion to titanium silicide 180. As previously described, various refractory metals or near noble metals may be used for the salicide process, but preferably titanium is sputtered in an argon atmosphere and then nitridated as previously described.

Figure 10:
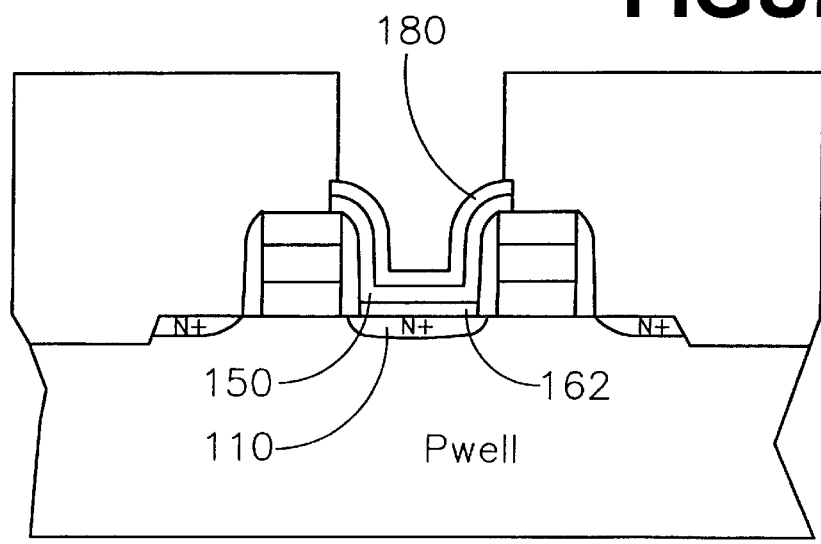
Figure 11:
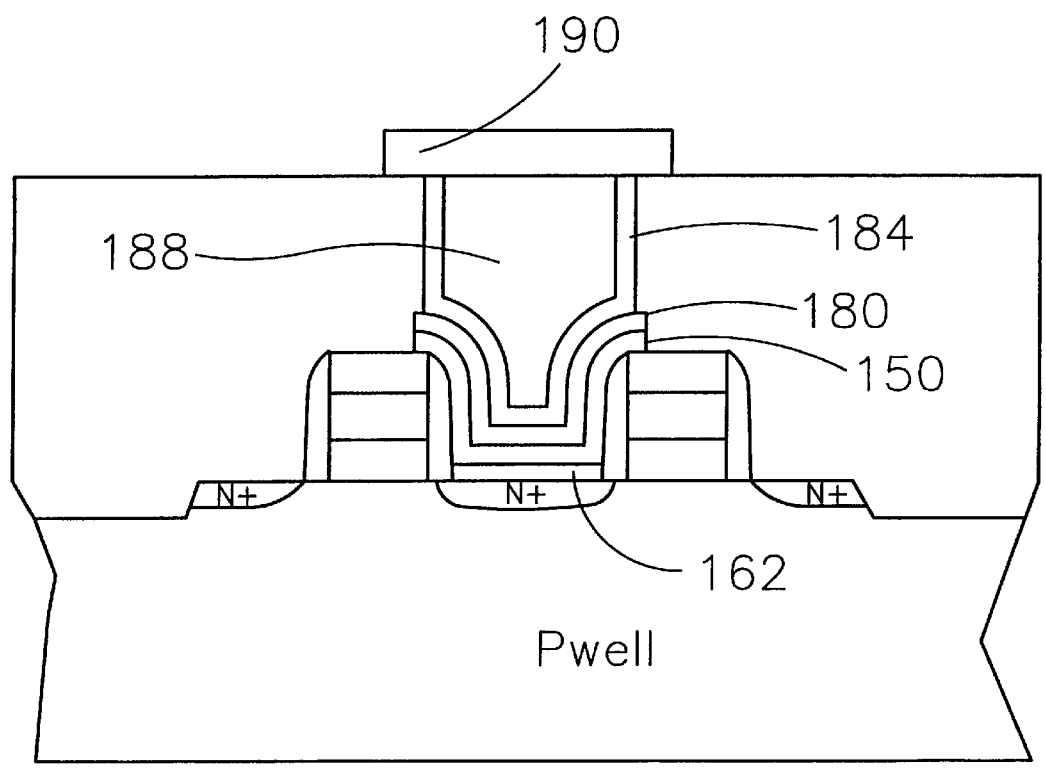

The resulting structure, as shown in FIG. 10, then includes a titanium silicide region 162 over the active n-type region 110 and a titanium nitride film 150 which provides a landing pad for the bit line contact with the formed titanium silicide region 180 thereover. After an adhesion layer 184 is deposited (FIG. 11) in contact hole 164, such as, for example, a titanium nitride adhesion layer, a metal deposition process is performed. For example, the metal deposition may include depositing tungsten 188 into contact hole 164. Thereafter, other metalization layers 190, such as aluminum or any other metal conventionally used may be deposited for connection to the bit line contact as is known to one skilled in the art.

As described above, the silicon hard mask provides a suitable means for patterning a titanium nitride interconnect, as described with reference to FIGS. 1–6. Further, the same silicon hard mask can then be utilized to provide a contact etch stop for etching a contact hole as described with reference to FIGS. 7–11. In addition, the dry etch of the silicon hard mask to form the titanium nitride interconnect and/or landing pad in accordance with the present invention allows for the selective stopping on the titanium nitride film.

Although the invention has been described above with particular reference to various embodiments thereof, variations and modifications of the present invention can be made within a contemplated scope of the following claims, as is readily known to one skilled in the art.

What is claimed is:

1. An interconnect, comprising:

a salicided active area;

a patterned titanium nitride interconnect film formed on at least the salicided active area using a silicon hard mask; and a titanium silicide contact area formed upon reacting at least a portion of the silicon hard mask with a deposited titanium film.

2. An interconnect, the interconnect comprising:

a first salicided active area;

a second salicided active area, the first and second salicided active areas isolated by a material; and a patterned titanium nitride interconnect film formed to connect the first and second salicided active areas using a silicon hard mask.

3. The interconnect according to claim 2, wherein the interconnect further includes a titanium silicide contact area formed upon reacting at least a portion of the silicon hard mask with a deposited titanium film.

* * * * *

UNITED STATES PATENT AND TRADEMARK OFFICE
CERTIFICATE OF CORRECTION

PATENT NO. : 6,160,296  
DATED : December 12, 2000  
INVENTOR(S) : Violette et al.

Page 1 of 1

It is certified that error appears in the above-identified patent and that said Letters Patent is hereby corrected as shown below:

<u>Title page,</u>
Item [62], delete "7,945,350" and insert -- 5,945,350 -- therefor.

Signed and Sealed this

Eighteenth Day of December, 2001

Attest:

JAMES E. ROGAN
*Attesting Officer*   *Director of the United States Patent and Trademark Office*